United States Patent
Hsia

(10) Patent No.: US 11,271,388 B2
(45) Date of Patent: Mar. 8, 2022

(54) SOLID-STATE LIGHTING WITH AUTO-TESTS AND RESPONSES

(71) Applicant: Aleddra Inc., Renton, WA (US)

(72) Inventor: Chungho Hsia, Bellevue, WA (US)

(73) Assignee: Aleddra Inc., Renton, WA (US)

( * ) Notice: Subject to any disclaimer, the term of this patent is extended or adjusted under 35 U.S.C. 154(b) by 43 days.

(21) Appl. No.: 17/076,748

(22) Filed: Oct. 21, 2020

(65) Prior Publication Data

US 2021/0044103 A1 Feb. 11, 2021

Related U.S. Application Data

(63) Continuation-in-part of application No. 17/026,903, filed on Sep. 21, 2020, which is a continuation-in-part
(Continued)

(51) Int. Cl.
*H02J 1/10* (2006.01)
*H02H 7/20* (2006.01)
(Continued)

(52) U.S. Cl.
CPC .......... *H02H 7/20* (2013.01); *G01R 31/2635* (2013.01); *H02H 1/0007* (2013.01); *H02J 7/0031* (2013.01); *H02J 7/0047* (2013.01); *H02J 7/04* (2013.01); *H02J 9/061* (2013.01); *H05B 45/355* (2020.01); *H05B 45/357* (2020.01); *H05B 45/382* (2020.01); *H02J 7/00714* (2020.01); *H02J 2207/20* (2020.01)

(58) Field of Classification Search
CPC ...... H05B 45/37; H05B 45/382; H05B 45/30; H05B 45/31; H05B 45/325; H02J 9/065; H02J 7/06; H02J 2207/20; H02J 7/04; H02J 7/00; H02J 7/0031; H02J 7/0048; H02J 7/0068; H02J 7/00714; Y02B 20/30; F21S 9/022; F21Y 2115/10
See application file for complete search history.

(56) References Cited

U.S. PATENT DOCUMENTS 9,667,096 B2 * 5/2017 Han .................... H02J 7/00712
2013/0127362 A1 * 5/2013 Trainor ................... H02J 9/065
315/224

* cited by examiner

*Primary Examiner* — Omar Rojas Cadima
(74) *Attorney, Agent, or Firm* — Han IP PLLC; Andy M. Han

(57) ABSTRACT

A light-emitting diode (LED) luminaire comprising an emergency-operated portion is used to replace a luminaire operated only with alternate-current (AC) mains. The emergency-operated portion comprises a rechargeable battery with a terminal voltage, a self-diagnostic circuit, and a transceiver circuit. The LED luminaire can auto-switch from the AC mains to an emergency power or the other way around according to availability of the AC mains and whether a rechargeable battery test is initiated. The self-diagnostic circuit comprises a clock and is configured to initiate self-diagnostic tests and to auto-evaluate battery performance according to test schedules with the terminal voltage examined and test results stored. The LED luminaire further comprises a remote controller configured to initiate remote control signals with phase-shift keying (PSK) signals transmitted. The transceiver circuit is configured to demodulate such PSK signals and send commands to the self-diagnostic circuit to request responses accordingly.

20 Claims, 4 Drawing Sheets

Related U.S. Application Data of application No. 17/016,296, filed on Sep. 9, 2020, which is a continuation-in-part of application No. 16/989,016, filed on Aug. 10, 2020, now Pat. No. 11,122,658, which is a continuation-in-part of application No. 16/929,540, filed on Jul. 15, 2020, now Pat. No. 11,116,057, which is a continuation-in-part of application No. 16/904,206, filed on Jun. 17, 2020, now Pat. No. 11,102,864, which is a continuation-in-part of application No. 16/880,375, filed on May 21, 2020, which is a continuation-in-part of application No. 16/861,137, filed on Apr. 28, 2020, now Pat. No. 10,992,161, which is a continuation-in-part of application No. 16/830,198, filed on Mar. 25, 2020, now Pat. No. 10,869,373, which is a continuation-in-part of application No. 16/735,410, filed on Jan. 6, 2020, now Pat. No. 10,660,179, which is a continuation-in-part of application No. 16/694,970, filed on Nov. 25, 2019, now Pat. No. 10,602,597, which is a continuation-in-part of application No. 16/681,740, filed on Nov. 12, 2019, now Pat. No. 10,959,310, which is a continuation-in-part of application No. 16/664,034, filed on Oct. 25, 2019, now Pat. No. 10,660,184, which is a continuation-in-part of application No. 16/572,040, filed on Sep. 16, 2019, now Pat. No. 10,645,782, which is a continuation-in-part of application No. 16/547,502, filed on Aug. 21, 2019, now Pat. No. 10,485,073, which is a continuation-in-part of application No. 16/530,747, filed on Aug. 2, 2019, now Pat. No. 10,492,265, which is a continuation-in-part of application No. 16/458,823, filed on Jul. 1, 2019, now Pat. No. 10,485,065, which is a continuation-in-part of application No. 16/432,735, filed on Jun. 5, 2019, now Pat. No. 10,390,396, which is a continuation-in-part of application No. 16/401,849, filed on May 2, 2019, now Pat. No. 10,390,395, which is a continuation-in-part of application No. 16/296,864, filed on Mar. 8, 2019, now Pat. No. 10,390,394, which is a continuation-in-part of application No. 16/269,510, filed on Feb. 6, 2019, now Pat. No. 10,314,123, which is a continuation-in-part of application No. 16/247,456, filed on Jan. 14, 2019, now Pat. No. 10,327,298, which is a continuation-in-part of application No. 16/208,510, filed on Dec. 3, 2018, now Pat. No. 10,237,946, which is a continuation-in-part of application No. 16/154,707, filed on Oct. 8, 2018, now Pat. No. 10,225,905, which is a continuation-in-part of application No. 15/947,631, filed on Apr. 6, 2018, now Pat. No. 10,123,388, which is a continuation-in-part of application No. 15/911,086, filed on Mar. 3, 2018, now Pat. No. 10,136,483, which is a continuation-in-part of application No. 15/897,106, filed on Feb. 14, 2018, now Pat. No. 10,161,616, which is a continuation-in-part of application No. 15/874,752, filed on Jan. 18, 2018, now Pat. No. 10,036,515, which is a continuation-in-part of application No. 15/836,170, filed on Dec. 8, 2017, now Pat. No. 10,021,753, which is a continuation-in-part of application No. 15/649,392, filed on Jul. 13, 2017, now Pat. No. 9,986,619, which is a continuation-in-part of application No. 15/444,536, filed on Feb. 28, 2017, now Pat. No. 9,826,595, which is a continuation-in-part of application No. 15/362,772, filed on Nov. 28, 2016, now Pat. No. 9,967,927, which is a continuation-in-part of application No. 15/225,748, filed on Aug. 1, 2016, now Pat. No. 9,743,484, which is a continuation-in-part of application No. 14/818,041, filed on Aug. 4, 2015, now Pat. No. 9,420,663, which is a continuation-in-part of application No. 14/688,841, filed on Apr. 16, 2015, now Pat. No. 9,288,867, which is a continuation-in-part of application No. 14/465,174, filed on Aug. 21, 2014, now Pat. No. 9,277,603, which is a continuation-in-part of application No. 14/135,116, filed on Dec. 19, 2013, now Pat. No. 9,163,818, which is a continuation-in-part of application No. 13/525,249, filed on Jun. 15, 2012, now Pat. No. 8,749,167.

(51) Int. Cl.

| | |
|---|---|
| *H05B 45/357* | (2020.01) |
| *H02J 7/04* | (2006.01) |
| *H05B 45/382* | (2020.01) |
| *H05B 45/355* | (2020.01) |
| *H02J 7/00* | (2006.01) |
| *H02J 9/06* | (2006.01) |
| *H02H 1/00* | (2006.01) |
| *G01R 31/26* | (2020.01) |

SOLID-STATE LIGHTING WITH AUTO-TESTS AND RESPONSES

CROSS-REFERENCE TO RELATED APPLICATIONS

The present disclosure is part of a continuation-in-part (CIP) application of U.S. patent application Ser. No. 17/026,903, filed 21 Sep. 2020, which is part of CIP application of U.S. patent application Ser. No. 17/016,296, filed 9 Sep. 2020, which is part of CIP application of U.S. patent application Ser. No. 16/989,016, filed 10 Aug. 2020, which is part of CIP application of U.S. patent application Ser. No. 16/929,540, filed 15 Jul. 2020, which is part of CIP application of U.S. patent application Ser. No. 16/904,206, filed 17 Jun. 2020, which is part of CIP application of U.S. patent application Ser. No. 16/880,375, filed 21 May 2020, which is part of CIP application of U.S. patent application Ser. No. 16/861,137, filed 28 Apr. 2020, which is part of CIP application of U.S. patent application Ser. No. 16/830,198, filed 25 Mar. 2020, which is part of CIP application of U.S. patent application Ser. No. 16/735,410, filed 6 Jan. 2020 and issued as U.S. Pat. No. 10,660,179 on 19 May 2020, which is part of CIP application of U.S. patent application Ser. No. 16/694,970, filed 25 Nov. 2019 and issued as U.S. Pat. No. 10,602,597 on 24 Mar. 2020, which is part of CIP application of U.S. patent application Ser. No. 16/681,740, filed 12 Nov. 2019, which is part of CIP application of U.S. patent application Ser. No. 16/664,034, filed 25 Oct. 2019 and issued as U.S. Pat. No. 10,660,184 on 19 May 2020, which is part of CIP application of U.S. patent application Ser. No. 16/572,040, filed 16 Sep. 2019 and issued as U.S. Pat. No. 10,645,782 on 5 May 2020, which is part of CIP application of U.S. patent application Ser. No. 16/547,502, filed 21 Aug. 2019 and issued as U.S. Pat. No. 10,485,073 on 19 Nov. 2019, which is part of CIP application of U.S. patent application Ser. No. 16/530,747, filed 2 Aug. 2019 and issued as U.S. Pat. No. 10,492,265 on 26 Nov. 2019, which is part of CIP application of U.S. patent application Ser. No. 16/458,823, filed 1 Jul. 2019 and issued as U.S. Pat. No. 10,485,065 on 19 Nov. 2019, which is part of CIP application of U.S. patent application Ser. No. 16/432,735, filed 5 Jun. 2019 and issued as U.S. Pat. No. 10,390,396 on 20 Aug. 2019, which is part of CIP application of U.S. patent application Ser. No. 16/401,849, filed 2 May 2019 and issued as U.S. Pat. No. 10,390,395 on 20 Aug. 2019, which is part of CIP application of U.S. patent application Ser. No. 16/296,864, filed 8 Mar. 2019 and issued as U.S. Pat. No. 10,390,394 on 20 Aug. 2019, which is part of CIP application of U.S. patent application Ser. No. 16/269,510, filed 6 Feb. 2019 and issued as U.S. Pat. No. 10,314,123 on 4 Jun. 2019, which is part of CIP application of U.S. patent application Ser. No. 16/247,456, filed 14 Jan. 2019 and issued as U.S. Pat. No. 10,327,298 on 18 Jun. 2019, which is part of CIP application of U.S. patent application Ser. No. 16/208,510, filed 3 Dec. 2018 and issued as U.S. Pat. No. 10,237,946 on 19 Mar. 2019, which is part of CIP application of U.S. patent application Ser. No. 16/154,707, filed 8 Oct. 2018 and issued as U.S. Pat. No. 10,225,905 on 5 Mar. 2019, which is part of a CIP application of U.S. patent application Ser. No. 15/947,631, filed 6 Apr. 2018 and issued as U.S. Patent No. 10,123,388 on 6 Nov. 2018, which is part of a CIP application of U.S. patent application Ser. No. 15/911,086, filed 3 Mar. 2018 and issued as U.S. Pat. No. 10,136,483 on 20 Nov. 2018, which is part of a CIP application of U.S. patent application Ser. No. 15/897,106, filed 14 Feb. 2018 and issued as U.S. Pat. No. 10,161,616 on 25 Dec. 2018, which is a CIP application of U.S. patent application Ser. No. 15/874,752, filed 18 Jan. 2018 and issued as U.S. Pat. No. 10,036,515 on 31 Jul. 2018, which is a CIP application of U.S. patent application Ser. No. 15/836,170, filed 8 Dec. 2017 and issued as U.S. Pat. No. 10,021,753 on 10 Jul. 2018, which is a CIP application of U.S. patent application of Ser. No. 15/649,392 filed 13 Jul. 2017 and issued as U.S. Pat. No. 9,986,619 on 29 May 2018, which is a CIP application of U.S. patent application Ser. No. 15/444,536, filed 28 Feb. 2017 and issued as U.S. Pat. No. 9,826,595 on 21 Nov. 2017, which is a CIP application of U.S. patent application Ser. No. 15/362,772, filed 28 Nov. 2016 and issued as U.S. Pat. No. 9,967,927 on 8 May 2018, which is a CIP application of U.S. patent application Ser. No. 15/225,748, filed 1 Aug. 2016 and issued as U.S. Pat. No. 9,743,484 on 22 Aug. 2017, which is a CIP application of U.S. patent application Ser. No. 14/818,041, filed 4 Aug. 2015 and issued as U.S. Pat. No. 9,420,663 on 16 Aug. 2016, which is a CIP application of U.S. patent application Ser. No. 14/688,841, filed 16 Apr. 2015 and issued as U.S. Pat. No. 9,288,867 on 15 Mar. 2016, which is a CIP application of U.S. patent application Ser. No. 14/465,174, filed 21 Aug. 2014 and issued as U.S. Pat. No. 9,277,603 on 1 Mar. 2016, which is a CIP application of U.S. patent application Ser. No. 14/135,116, filed 19 Dec. 2013 and issued as U.S. Pat. No. 9,163,818 on 20 Oct. 2015, which is a CIP application of U.S. patent application Ser. No. 13/525,249, filed 15 Jun. 2012 and issued as U.S. Pat. No. 8,749,167 on 10 Jun. 2014. Contents of the above-identified applications are incorporated herein by reference in their entirety.

BACKGROUND

Technical Field

The present disclosure relates to light-emitting diode (LED) luminaires and more particularly to an LED luminaire that includes a self-diagnostic circuit to auto-test a rechargeable battery according to a test schedule provided by a real-time clock and to respond to an emergency lighting management system with test results when requested.

Description of the Related Art

Solid-state lighting from semiconductor LEDs has received much attention in general lighting applications today. Because of its potential for more energy savings, better environmental protection (with no hazardous materials used), higher efficiency, smaller size, and longer lifetime than conventional incandescent bulbs and fluorescent tubes, the LED-based solid-state lighting will be a mainstream for general lighting in the near future. Meanwhile, as LED technologies develop with the drive for energy efficiency and clean technologies worldwide, more families and organizations will adopt LED lighting for their illumination applications. In this trend, the potential safety concerns such as risk of electric shock and fire become especially important and need to be well addressed.

In today's retrofit applications of an LED luminaire to replace an existing fluorescent luminaire, consumers may choose either to adopt a ballast-compatible LED luminaire with an existing ballast used to operate the fluorescent luminaire or to employ an alternate-current (AC) mains-operable LED luminaire by removing/bypassing the ballast. Either application has its advantages and disadvantages. In the former case, although the ballast consumes extra power, it is straightforward to replace the fluorescent luminaire without rewiring, which consumers have a first impression that it is the best alternative. But the fact is that total cost of ownership for this approach is high regardless of very low initial cost. For example, the ballast-compatible LED luminaires work only with particular types of ballasts. If the existing ballast is not compatible with the ballast-compatible LED luminaire, the consumer will have to replace the ballast. Some facilities built long time ago incorporate different types of fixtures, which requires extensive labor for both identifying ballasts and replacing incompatible ones. Moreover, the ballast-compatible LED luminaire can operate longer than the ballast. When an old ballast fails, a new ballast will be needed to replace in order to keep the ballast-compatible LED luminaires working. Maintenance will be complicated, sometimes for the luminaires and sometimes for the ballasts. The incurred cost will preponderate over the initial cost savings by changeover to the ballast-compatible LED luminaires for hundreds of fixtures throughout a facility. In addition, replacing a failed ballast requires a certified electrician. The labor costs and long-term maintenance costs will be unacceptable to end users. From energy saving point of view, a ballast constantly draws power, even when the ballast-compatible LED luminaires are dead or not installed. In this sense, any energy saved while using the ballast-compatible LED luminaires becomes meaningless with the constant energy use by the ballast. In the long run, the ballast-compatible LED luminaires are more expensive and less efficient than self-sustaining AC mains-operable LED luminaires.

On the contrary, the AC mains-operable LED luminaire does not require a ballast to operate. Before use of the AC mains-operable LED luminaire, the ballast in a fixture must be removed or bypassed. Removing or bypassing the ballast does not require an electrician and can be replaced by end users. Each AC mains-operable LED luminaire is self-sustaining. Once installed, the AC mains-operable LED luminaires will only need to be replaced after 50,000 hours. In view of above advantages and disadvantages of both the ballast-compatible LED luminaires and the AC mains-operable LED luminaires, it seems that market needs a most cost-effective solution by using a universal LED luminaire that can be used with the AC mains and is compatible with a ballast so that LED luminaire users can save an initial cost by changeover to such an LED luminaire followed by retrofitting the luminaire fixture to be used with the AC mains when the ballast dies.

Furthermore, the AC mains-operable LED luminaires can easily be used with emergency lighting, which is especially important in this consumerism era. The emergency lighting systems in retail sales and assembly areas with an occupancy load of 100 or more are required by codes in many cities. Occupational Safety and Health Administration (OSHA) requires that a building's exit paths be properly and automatically lighted at least ninety minutes of illumination at a minimum of 10.8 lux so that an employee with normal vision can see along the exit route after the building power becomes unavailable. This means that emergency egress lighting must operate reliably and effectively during low visibility evacuations. To ensure reliability and effectiveness of backup lighting, building owners should abide by the National Fire Protection Association's (NFPA) emergency egress light requirements that emphasize performance, operation, power source, and testing. OSHA requires most commercial buildings to adhere to the NFPA standards or a significant fine. Meeting OSHA requirements takes time and investment, but not meeting them could result in fines and even prosecution. If a building has egress lighting problems that constitute code violations, the quickest way to fix is to replace existing luminaires with multi-function LED luminaires that have an emergency light package integrated with the normal lighting. The code also requires the emergency lights be periodically inspected and tested to ensure they are in proper working conditions at all times. It is, therefore, the manufacturers' responsibility to design an LED luminaire, an LED luminaire, or an LED lighting system with a self-diagnostic mechanism such that after the LED luminaire or the LED luminaire is installed on a ceiling or a high place in a room, the self-diagnostic mechanism can work with an emergency battery backup system to periodically auto-test charging and discharging current to meet regulatory requirements without safety issues. Furthermore, whereas the code also requires that written records documenting the testing be maintained and available for review by local fire departments, the market needs all of self-diagnostic test results to be transmitted to a central station to be recorded when many of the LED luminaires, each with an emergency-operated portion, are widely deployed in a field covering many buildings. In this disclosure, how to process and to respond the self-diagnostic test results in the LED luminaire are addressed.

SUMMARY

A LED luminaire comprising a normally operated portion and an emergency-operated portion is used to replace a luminaire operated only in a normal mode with the AC mains. The normally operated portion comprises one or more LED arrays and a power supply unit that powers the one or more LED arrays when a line voltage from the AC mains is available. The emergency-operated portion comprises a rechargeable battery with a terminal voltage, a control and test circuit, a first transceiver circuit, and an LED driving circuit configured to receive power from the rechargeable battery and to generate a voltage operating the one or more LED arrays when the line voltage from the AC mains is unavailable. The control and test circuit comprises a self-diagnostic circuit and a charging detection and control circuit. The control and test circuit is configured to either enable or disable the LED driving circuit and the power supply unit according to availability of the AC mains and whether a rechargeable battery test is initiated. The charging detection and control circuit comprises a first transistor circuit configured to detect a charging voltage.

The power supply unit comprises at least two electrical conductors configured to receive an input AC voltage, a main full-wave rectifier, and an input filter. The at least two electrical conductors are configured to couple to the emergency-operated portion. The main full-wave rectifier is coupled to the at least two electrical conductors and configured to convert the input AC voltage into a primary direct-current (DC) voltage. The input filter is configured to suppress electromagnetic interference (EMI) noises. The power supply unit further comprises a power switching converter comprising a main transformer and a power factor correction (PFC) and power switching circuit. The PFC and power switching circuit is coupled to the main full-wave rectifier via the input filter and configured to improve a power factor and to convert the primary DC voltage into a main DC voltage with a first LED driving current. The main DC voltage with the first LED driving current is configured to couple to the one or more LED arrays to operate thereof.

The emergency-operated portion further comprises at least one full-wave rectifier and a charging circuit. The at least one full-wave rectifier is coupled to the AC mains and configured to convert the line voltage from the AC mains into a first DC voltage. The charging circuit comprises a charging control device, a first transformer, a first ground reference, and a second ground reference electrically isolated from the first ground reference. The charging circuit is coupled to the at least one full-wave rectifier and configured to convert the first DC voltage into a second DC voltage that charges the rechargeable battery to reach a nominal third DC voltage. The charging circuit is configured to monitor the second DC voltage and to regulate the charging control device in response to various charging requirements. The LED driving circuit is configured to convert the terminal voltage of the rechargeable battery into a fourth DC voltage with a second LED driving current to drive the one or more LED arrays when the line voltage from the AC mains is unavailable.

The self-diagnostic circuit comprises a real-time clock, a control portion, and a test portion. The self-diagnostic circuit is configured to initiate the rechargeable battery test according to predetermined test schedules provided by the real-time clock. Each of the predetermined test schedules comprises a test period immediately following an initiation of a test event. Upon the initiation of the test event, the test period begins with an output of the self-diagnostic circuit activated to reach a logic-high level and remaining activated so as to enable the LED driving circuit and the test and control unit. At an end of the test period, the output of the self-diagnostic circuit is inactivated to drop to a logic-low level. A duration of the test period is configured to allow the self-diagnostic circuit to control discharging of the rechargeable battery and to perform the rechargeable battery test. Specifically, whereas the real-time clock starts with a reset, the predetermined test schedules comprise a first kind of the test event and a second kind of the test event respectively at an end of each month and at an end of each year after the reset. Respective test periods of the predetermined test schedules comprise a nominal duration of 30 seconds and 90 minutes.

The charging detection and control circuit further comprises a peripheral circuit. The peripheral circuit is configured to sample a fraction of the terminal voltage of the rechargeable battery and to deliver to the test portion to examine over a duration of the test period when the rechargeable battery test is initiated by the self-diagnostic circuit. The test portion is configured to perform a pass/fail test. When the terminal voltage drops below a first predetermined level over the duration of the test period, the test portion assesses the rechargeable battery test as a "failure", a "no-go", a "no", or a "1". The charging detection and control circuit further comprises at least one status indicator configured to show self-diagnostic test results.

The control portion is configured to receive a signal from the first transistor circuit and to send a first control signal to the charging control device to inactivate the charging circuit when the rechargeable battery test is initiated. The charging detection and control circuit is coupled between the charging circuit and the rechargeable battery and controlled by the self-diagnostic circuit. When the first transistor circuit detects the charging voltage, a pull-down signal is sent to the self-diagnostic circuit to enable a normal charging process. The charging detection and control circuit further comprises a charging control circuit configured to either allow or prohibit a charging current to flow into the rechargeable battery according to availability of the AC mains. The charging control circuit prohibits the charging current to flow into the rechargeable battery when the rechargeable battery test is initiated. The charging control circuit comprises a second transistor circuit and a metal-oxide-semiconductor field-effect transistor (MOSFET). The second transistor circuit is configured to receive a high-level signal approximately equal to an operating voltage of the self-diagnostic circuit therefrom to pull down a bias voltage of the MOSFET, thereby disconnecting the charging current when the rechargeable battery test is initiated.

The charging detection and control circuit further comprises at least one pair of electrical contacts configured to electrically couple the rechargeable battery to the charging circuit, the LED driving circuit, and the self-diagnostic circuit to operate thereof when the rechargeable battery test is initiated or when the line voltage from the AC mains is not available. When disconnected, the at least one pair of electrical contacts can prevent the rechargeable battery from being drained. The at least one pair of electrical contacts comprise electrical contacts in a switch, a relay, and a jumper, or electrical terminals accommodated for jumper wires. The charging detection and control circuit further comprises a test switch coupled to the self-diagnostic circuit and configured to manually initiate and terminate either a 30-second test or a 90-minute test of the rechargeable battery. The charging detection and control circuit further comprises at least one status indicator configured to couple to the self-diagnostic circuit. When either the 30-second test or the 90-minute test is manually initiated and when the terminal voltage is examined to be respectively lower than either a second predetermined level or a third predetermined level, the self-diagnostic circuit chooses not to perform respective tests with a status signal sent to the at least one status indicator to show that the rechargeable battery is insufficiently charged for the respective tests.

The real-time clock further comprises a random-access memory (RAM) whereas the self-diagnostic circuit further comprises a data bus connected to the real-time clock. At the end of the test period, a test result of the pass/fail test is serially transmitted via the data bus to the RAM. The RAM is configured to store multiple attribute data of self-diagnostic test results in multiple pass/fail tests over the predetermined test schedules with information of self-diagnostic test times. Both the multiple attribute data of the self-diagnostic test results and the information of the self-diagnostic test times can be serially transferred to the first transceiver circuit when requested. The real-time clock further comprises a primary power supply, a backup power supply, and a built-in power-sense circuit configured to detect power outages and to automatically switch from the primary power supply to the backup power supply to sustain operating the real-time clock without a loss of the predetermined test schedules, the multiple attribute data of the self-diagnostic test results, and the information of the self-diagnostic test times.

The test and control unit may comprise a microcontroller, a microchip, a microprocessor, or a programmable logic controller. In this disclosure, the emergency-operated portion is integrated into the LED luminaire with the self-diagnostic circuit to auto-test charging and discharging current of a rechargeable battery with self-diagnostic test results displayed in a status indicator, supporting dual mode operations of the LED luminaire to work not only in a normal mode but also in an emergency mode. However, as mentioned above, the self-diagnostic test results may be stored in the self-diagnostic circuit, queuing for transmitting to the first transceiver circuit. Furthermore, the self-diagnostic test results may be transmitted to a central station to be recorded for further reviews when requested. It is especially essential when many LED luminaires with the emergency-operated portion are widely deployed in a field covering many buildings. Although being likely integrated in the LED luminaire, the emergency-operated portion may be attached to the power supply unit to sustain lighting up the one or more LED arrays at a fraction of the full power when the line voltage from the AC mains is unavailable.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified. Moreover, in the section of detailed description of the invention, any of a "main", a "primary", a "first", a "second", a "third", and so forth does not necessarily represent a part that is mentioned in an ordinal manner, but a particular one.

DETAILED DESCRIPTION OF THE INVENTION

Figure 1:
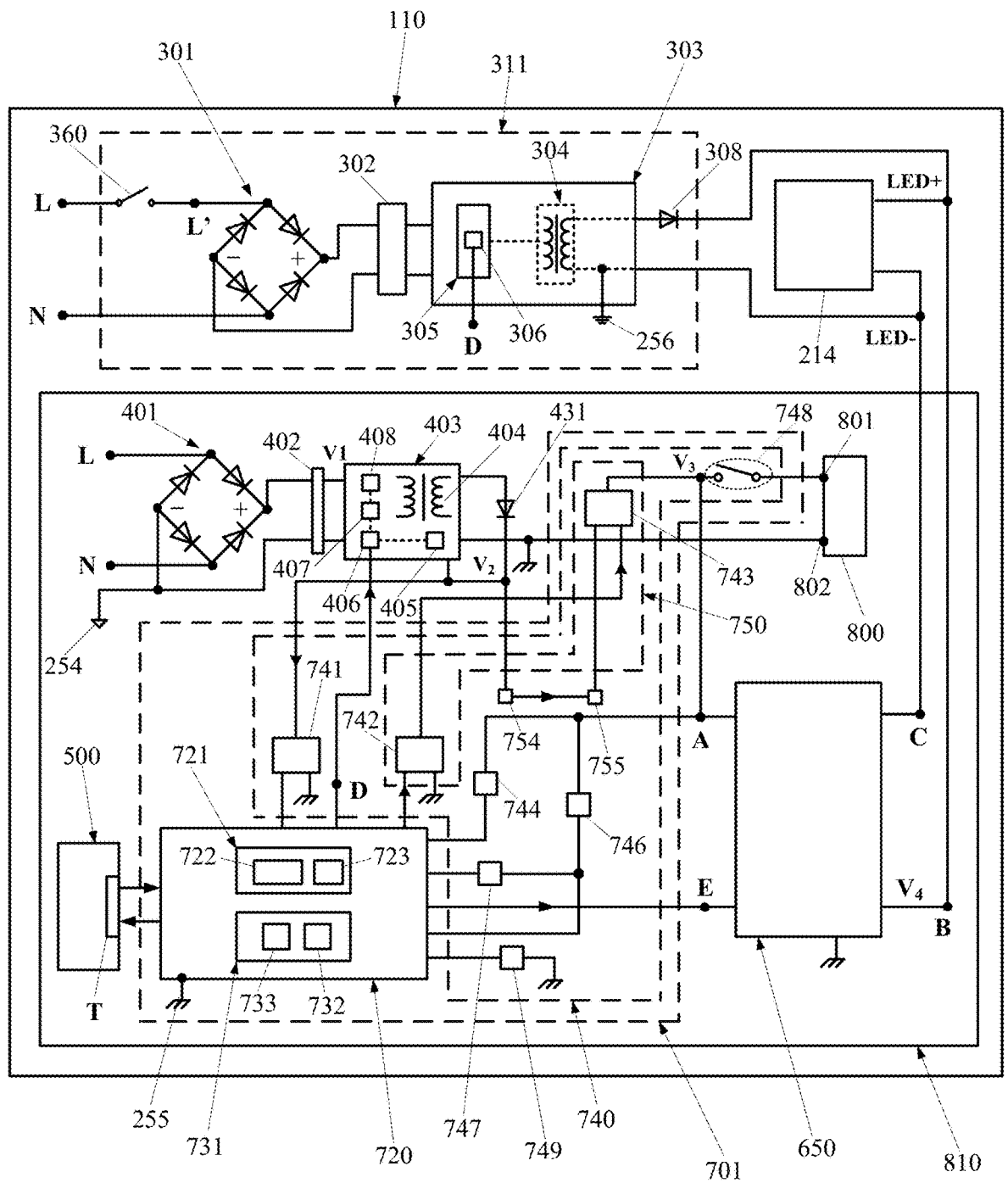
FIG. 1 is a block diagram of an LED luminaire according to the present disclosure.

FIG. 1 is a block diagram of an LED luminaire according to the present disclosure. An LED luminaire 110 is used to replace a fluorescent or an LED luminaire normally operated with the AC mains in a normal mode. In FIG. 1, the LED luminaire 110 comprises an emergency-operated portion 810, one or more LED arrays 214 with a forward voltage across thereof, and a power supply unit 311 that powers the one or more LED arrays 214 when the line voltage from the AC mains is available. The emergency-operated portion 810 comprises an LED driving circuit 650 configured to provide an emergency power (a voltage and a current) to drive the one or more LED arrays 214 when the line voltage from the AC mains is unavailable. The power supply unit 311 originally designed to receive the line voltage from the AC mains for general lighting applications is configured to operate in the normal mode. The power supply unit 311 comprises at least two electrical conductors "L" and "N", a main full-wave rectifier 301, and an input filter 302. The at least two electrical conductors "L" and "N" are configured to couple to "L" and "N" via a power switch 360. The main full-wave rectifier 301 is configured to convert the line voltage from the AC mains into a primary DC voltage. In other words, the at least two electrical conductors "L" and "N" are coupled to a switched power, in which the power supply unit 311 can be turned off when the LED luminaire 110 is not in use during nighttime. The input filter 302 is configured to suppress electromagnetic interference (EMI) noises. The power supply unit 311 further comprises a power switching converter 303 comprising a main transformer 304 and a power factor correction (PFC) and power switching circuit 305. The PFC and power switching circuit 305 is coupled to the main full-wave rectifier 301 via the input filter 302 and configured to improve a power factor and to allow the power switching converter 303 to convert the primary DC voltage into a main DC voltage. The main DC voltage is configured to couple to the one or more LED arrays 214 to operate thereon. The main transformer 304 comprises a third ground reference 256, electrically isolated from a negative (−) port of the main full-wave rectifier 301. The one or more LED arrays 214 comprises a first terminal LED+ and a second terminal LED− configured to receive an LED driving current from the first terminal LED+ and to return from the second terminal LED− to either the LED driving circuit 650 or the power supply unit 311, depending on which one is a source of the LED driving current. The power switching converter 303 is a current source configured to provide the first LED driving current to the one or more LED arrays 214 to operate thereon. The PFC and power switching circuit 305 comprises a main control device 306 configured to receive a pull-down signal via a port "D" to disable the PFC and power switching circuit 305 so that the power switching converter 303 ceases to provide the first LED driving current to drive the one or more LED arrays 214 when a rechargeable battery test is initiated.

In FIG. 1, the emergency-operated portion 810 further comprises the at least two electrical conductors "L" and "N" configured to couple to the AC mains, a rechargeable battery 800, at least one full-wave rectifier 401, at least one input filter 402 coupled to the at least one full-wave rectifier 401, a charging circuit 403, and a control and test circuit 701. The at least one full-wave rectifier 401 is coupled to the at least two electrical conductors "L" and "N" and configured to convert the line voltage from the AC mains into a first DC voltage. The at least one input filter 402 is configured to suppress EMI noises. The rechargeable battery 800 comprises a high-potential electrode 801 and a low-potential electrode 802 with a terminal voltage across thereon. The charging circuit 403 is an isolated step-down converter and comprises a first ground reference 254, a second ground reference 255 electrically isolated from the first ground reference 254, a first transformer 404, a feedback control circuit 405, a charging control device 406, a first electronic switch 407, and a diode 408. The charging circuit 403 is coupled to the at least one full-wave rectifier 401 via the input filter 402 and configured to convert the first DC voltage into a second DC voltage that charges the terminal voltage of the rechargeable battery 800 to reach a nominal third DC voltage. Please note that the terminal voltage of the rechargeable battery 800 may be slightly less than the nominal third DC voltage because the rechargeable battery 800 ages or an ambient temperature is below an optimum operating temperature. When the rechargeable battery 800 badly ages or goes wrong, the terminal voltage may be far from the nominal third DC voltage. That is why the rechargeable battery test is needed to ensure that the rechargeable battery 800 is working all the time. The feedback control circuit 405 is configured to monitor the second DC voltage ($V_2$) via a diode 431 and to regulate the charging control device 406 according to charging voltage and current requirements. The first transformer 404 comprises a primary winding coupled to the first ground reference 254 and a secondary winding coupled to the second ground reference 255. The first transformer 404 is configured to provide electrical isolation between the AC mains and the second DC voltage with respect to the second ground reference 255. In FIG. 1, the second ground reference 255 is electrically coupled to the low-potential electrode 802 to ease a charging current to flow into the rechargeable battery 800 and to return to the charging circuit 403, completing a power transfer.

In FIG. 1, the control and test circuit 701 further comprises a self-diagnostic circuit 720 and a charging detection and control circuit 740. The control and test circuit 701 is configured to either enable or disable the LED driving circuit 650 via a port denoted as "E" according to availability of the AC mains and whether a rechargeable battery test is initiated. The charging detection and control circuit 740 comprises a first transistor circuit 741 configured to detect a charging voltage (i.e. the second DC voltage) generated from the charging circuit 403. In FIG. 1, the emergency-operated portion 810 further comprises a first transceiver circuit 500 configured to receive and demodulate various phase-shift keying (PSK) band-pass signals and to communicate with the self-diagnostic circuit 720. The self-diagnostic circuit 720 comprises a test and control unit 721 comprising a test portion 722 and a control portion 723 respectively configured to examine the terminal voltage and to control charging and discharging of the rechargeable battery 800.

In FIG. 1, the charging detection and control circuit 740 further comprises a voltage regulator 746 configured to adjust the nominal third DC voltage or the terminal voltage of the rechargeable battery 800 to an operating voltage of the self-diagnostic circuit 720 to operate thereof. The self-diagnostic circuit 720 further comprises a real-time clock 731. The self-diagnostic circuit 720 is configured to initiate the rechargeable battery test according to predetermined test schedules provided by the real-time clock 731. The charging detection and control circuit 740 further comprises a peripheral circuit 744. The peripheral circuit 744 is configured to sample a fraction of the terminal voltage of the rechargeable battery 800 and to deliver to the test portion 722 to examine over a duration of the test period when the rechargeable battery test is initiated. The test portion 722 is configured to examine the terminal voltage of the rechargeable battery 800 and to perform a pass/fail test. When the terminal voltage drops below a first predetermined level over the duration of the test period, the test portion 722 assesses the rechargeable battery test as a "failure", a "no-go", a "no", or a "1".

In FIG. 1, the control portion 723 is configured to receive a pull-up signal from the first transistor circuit 741 and to send a first control signal via the port "D" to the charging control device 406 to inactivate the charging circuit 403 when the rechargeable battery test is initiated. Note that the first control signal is also sent to the main control device 306 via the port "D" to inactivate the power switching converter 303 when the rechargeable battery test is initiated. The charging detection and control circuit 740 is coupled between the charging circuit 403 and the rechargeable battery 800 and controlled by the self-diagnostic circuit 720. When the first transistor circuit 741 detects the charging voltage, a pull-down signal is sent to the self-diagnostic circuit 720 to enable a normal charging process. The charging detection and control circuit 740 further comprises a charging control circuit 750 comprising a second transistor circuit 742 and a metal-oxide-semiconductor field-effect transistor (MOSFET) 743. The charging control circuit 750 is configured to either allow or prohibit a charging current to flow into the rechargeable battery 800 according to availability of the AC mains. The charging control circuit 750 prohibits the charging current to flow into the rechargeable battery 800 when the rechargeable battery test is initiated. The second transistor circuit 742 is configured to receive a high-level signal approximately equal to an operating voltage of the self-diagnostic circuit 720 therefrom to pull down a bias voltage of the MOSFET 743, thereby disconnecting the charging current when the rechargeable battery test is initiated.

The charging detection and control circuit 740 further comprises at least one pair of electrical contacts 748 configured to electrically couple the rechargeable battery 800 to the charging circuit 403, the LED driving circuit 650, and the self-diagnostic circuit 720 when the at least one pair of electrical contacts 748 are connected. When the rechargeable battery test is initiated or when the line voltage from the AC mains is unavailable, power from the rechargeable battery 800 can operate both the LED driving circuit 650 and the self-diagnostic circuit 720. On the other hand, when disconnected, the at least one pair of electrical contacts 748 can safely prevent the rechargeable battery 800 from being drained. The at least one pair of electrical contacts 748 comprise electrical contacts in a switch, a relay, and a jumper, or electrical terminals accommodated for jumper wires.

In FIG. 1, the charging detection and control circuit 740 further comprises at least one status indicator 747 controlled by the self-diagnostic circuit 720 and configured to show self-diagnostic test results with various codes. The charging detection and control circuit 740 further comprises a test switch 749 coupled to the self-diagnostic circuit 720 and is configured to manually have the self-diagnostic circuit 720 initiate the rechargeable battery test. The test switch 749 may be further configured to manually have the self-diagnostic circuit 720 terminate the rechargeable battery test that is in progress. That is to say, the test switch 749 may be configured to manually initiate and terminate either a 30-second test or a 90-minute test of the rechargeable battery 800. When either the 30-second test or the 90-minute test is manually initiated and when the terminal voltage is examined to be respectively lower than either a second predetermined level or a third predetermined level, the self-diagnostic circuit 720 may choose not to perform respective tests with a status signal sent to the at least one status indicator 747 to show that the rechargeable battery 800 is insufficiently charged for the respective tests.

In FIG. 1, the charging detection and control circuit 740 further comprises at least one diode 754 and at least one resistor 755 connected in series with the at least one diode 754. The at least one diode 754 and the at least one resistor 755 are electrically coupled between the charging circuit 403 and the rechargeable battery 800 and configured to control a current flowing direction and to set up a voltage drop so that the first transistor circuit 741 can readily detect whether the charging voltage exists and determine whether the line voltage from the AC mains is available or not. In FIG. 1, the power supply unit 311 further comprises a first current blocking diode 308 coupled between the power switching converter 303 and the one or more LED arrays 214. The first current blocking diode 308 is configured to couple to the one or more LED arrays 214 to prevent the second LED driving current provided by the LED driving circuit 650 from flowing in, avoiding crosstalk. Similarly, the LED driving circuit 650 may further comprise a second current blocking diode 607 configured to couple to the one or more LED arrays 214 to prevent the first LED driving current provided by the power supply unit 311 from flowing in, avoiding crosstalk.

In FIG. 1, the test and control unit 721 may comprise a microcontroller, a microchip, a microprocessor, or a programmable logic controller. In this disclosure, the emergency-operated portion 810 is depicted to be integrated into the LED luminaire 110 with the self-diagnostic circuit 720 to auto-test charging and discharging current of a rechargeable battery 800 with self-diagnostic test results displayed in a status indicator, supporting dual mode operations of the LED luminaire 110 to work not only in a normal mode but also in an emergency mode. As mentioned above, the self-diagnostic test results may be stored in the self-diagnostic circuit 720, queuing for transmitting to the first transceiver circuit 500. Furthermore, the self-diagnostic test results may be transmitted to a central station to be recorded when requested. It is especially important when many of the LED luminaire 110 with the emergency-operated portion 810 are widely deployed in a field covering many buildings. Although being integrated in the LED luminaire 110 in FIG. 1, the emergency-operated portion 810 may be attached to the power supply unit 311 to sustain lighting up the one or more LED arrays 214 at a fraction of the full power when the line voltage from the AC mains is unavailable.

Figure 2:
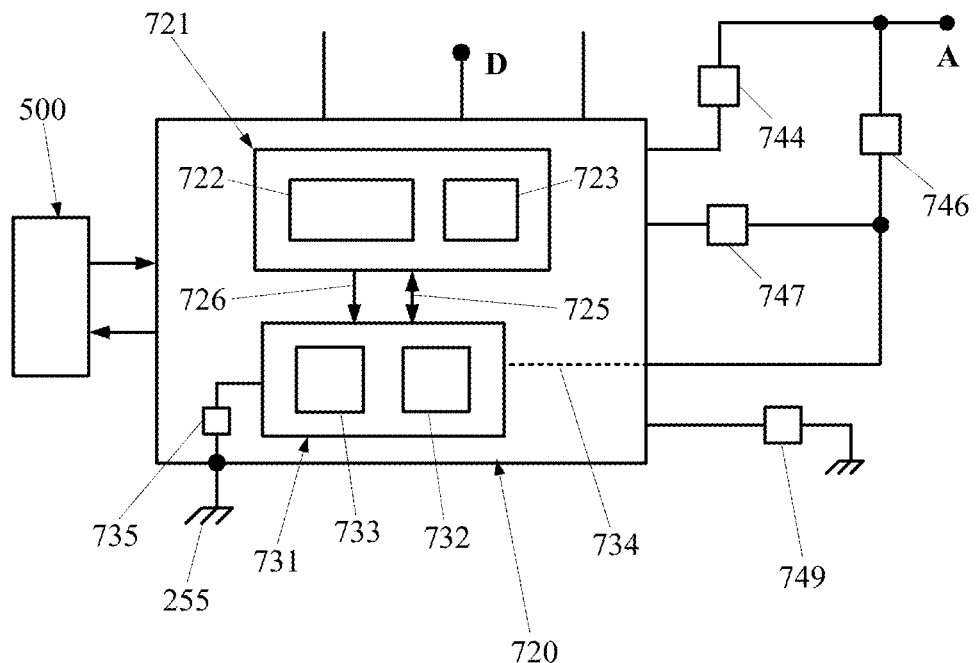
FIG. 2 is a block diagram of a self-diagnostic circuit according to the present disclosure.

FIG. 2 is a block diagram of a self-diagnostic circuit according to the present disclosure. As depicted in FIG. 1, the self-diagnostic circuit 720 comprises the real-time clock 731 and the test and control unit 721 comprising the test portion 722 and the control portion 723. The self-diagnostic circuit 720 is configured to initiate the rechargeable battery test according to predetermined test schedules provided by the real-time clock 731. In FIG. 2, the real-time clock 731 further comprises a random-access memory (RAM) 732 whereas the self-diagnostic circuit 720 further comprises a data bus 725 and a serial clock 726 both connected to the real-time clock 731. At the end of the test period, a test result of the pass/fail test is serially transmitted via the data bus 725 to the RAM 732. The serial clock 726 is configured to synchronize such a data transfer via the data bus 725. The RAM 732 is configured to store multiple attribute data of self-diagnostic test results in multiple pass/fail tests over the predetermined test schedules with information of self-diagnostic test times such as a year, a month, and a day in a calendar. Both the multiple attribute data of the self-diagnostic test results and the information of the self-diagnostic test times are serially transferred to the first transceiver circuit 500 when requested. The real-time clock 731 further comprises a primary power supply 734, a backup power supply 735, and a built-in power-sense circuit 733 configured to detect power outages and to automatically switch from the primary power supply 734 to the backup power supply 735 to sustain operating the real-time clock 731 without a loss of the predetermined test schedules, the multiple attribute data of the self-diagnostic test results, and the information of the self-diagnostic test times. As depicted in FIG. 1, the voltage regulator 746 is configured to adjust the nominal third DC voltage or the terminal voltage of the rechargeable battery 800 to an operating voltage of the self-diagnostic circuit 720 to operate thereof. Whereas the primary power supply 734 receives the operating voltage of the self-diagnostic circuit 720, the backup power supply 735 uses a small battery as a backup supply.

Figure 3:
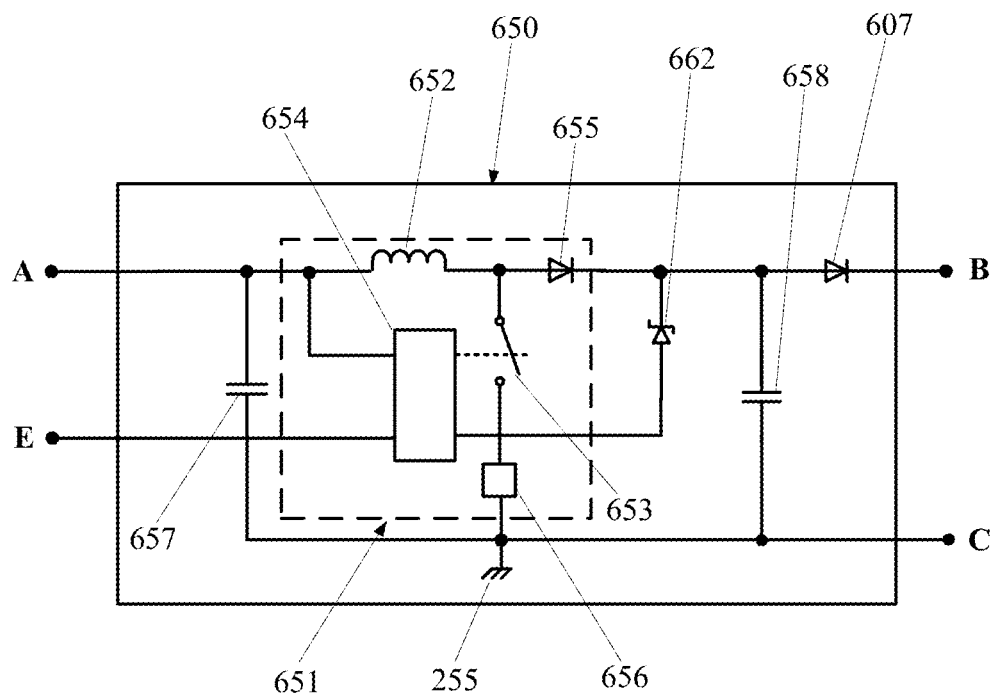
FIG. 3 is a block diagram of an LED driving circuit according to the present disclosure.

FIG. 3 is a block diagram of the LED driving circuit 650 according to the present disclosure. The LED driving circuit 650 comprises a step-up converter 651 comprising an input inductor 652, an electronic switch 653, a logic control device 654, at least one diode rectifier 655, and a sensing resistor 656. The LED driving circuit 650 further comprises an input capacitor 657, an output capacitor 658 coupled between the at least one diode rectifier 655 and the second ground reference 255 at a port "C", and a Zener diode 662, in which the input capacitor 657 and the output capacitor 658 are configured to filter out unwanted voltage noises generated from the step-up converter 651. The LED driving circuit 650 is configured to boost the terminal voltage into a fourth DC voltage at a port "B" with respect to the second ground reference 255 and to provide the second LED driving current. The logic control device 654 is configured to control the electronic switch 653 "on" and "off". The LED driving circuit 650 is configured to couple to the terminal voltage (i.e. the nominal third DC voltage, $V_3$) via a port denoted as "A" from the rechargeable battery 800. The LED driving circuit 650 further comprises the port "E" to receive an "enable" signal from the self-diagnostic circuit 720 (FIG. 1) to activate the LED driving circuit 650 when the line voltage from the AC mains is unavailable or when the rechargeable battery test is initiated. The fourth DC voltage is greater than an intrinsic forward voltage of the one or more LED arrays 214 to ensure operating the one or more LED arrays 214 without failure when the line voltage from the AC mains is unavailable. In other words, the LED driving circuit 650 is configured to receive the terminal voltage from the rechargeable battery 800 and to convert the terminal voltage into the fourth DC voltage with the second LED driving current to power up the one or more LED arrays 214 when the line voltage from the AC mains is unavailable. On the other hand, the power supply unit 311 is configured to generate the main DC voltage with the first LED driving current to power up the one or more LED arrays 214 at full power and to meet LED luminaire efficacy requirements when the line voltage from the AC mains is available.

Figure 4:
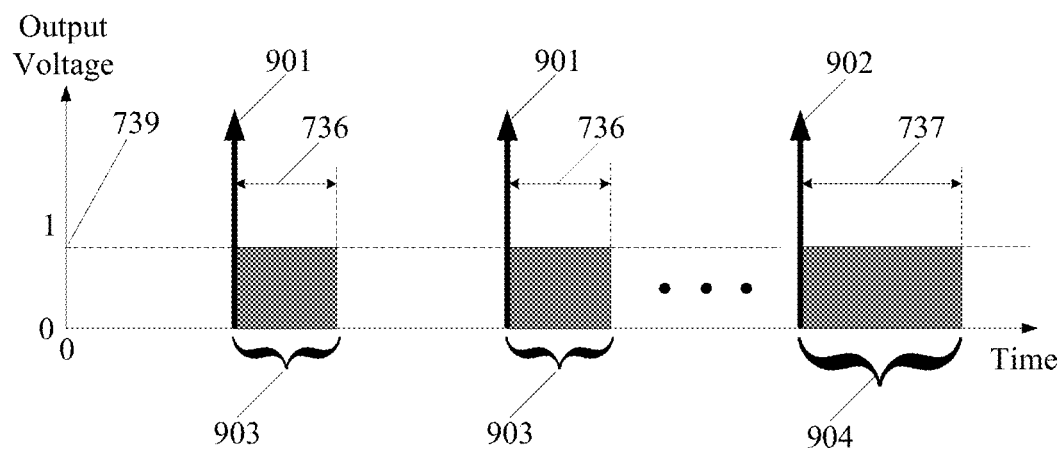
FIG. 4 is a timing diagram of a self-diagnostic circuit according to the present disclosure.

FIG. 4 is a timing diagram of the self-diagnostic circuit 720 according to the present disclosure. The self-diagnostic circuit 720 comprises the real-time clock 731, the test portion 722, and the control portion 723. The self-diagnostic circuit 720 is configured to initiate the rechargeable battery test according to predetermined test schedules provided by the real-time clock 731. Each of the predetermined test schedules comprises a test period immediately following an initiation of a test event. Upon the initiation of the test event, such as a first kind of an initiation 901 and a second kind of an initiation 902, the test period begins with an output 739 of the self-diagnostic circuit 720 activated to reach a logic-high level (i.e. "1" state) and remaining activated so as to enable the LED driving circuit 650 and the test and control unit 721. At an end of the test period, the output 739 of the self-diagnostic circuit 720 is inactivated to drop to a logic-low level (i.e. "0" state). A duration of the test period is configured to allow the self-diagnostic circuit 720 to control discharging of the rechargeable battery 800 and to perform the rechargeable battery test. Specifically, whereas the real-time clock starts with a reset, the predetermined test schedules comprise a first kind of the test event 903 and a second kind of the test event 904 respectively at an end of each month and at an end of each year after the reset. The reset is needed when the LED luminaire 110 is first installed. The first kind of the test event 903 and a second kind of the test event respectively comprise a test period 736 and a test period 737, which respectively comprise a nominal duration of 30 seconds and 90 minutes. In FIG. 4, the output 739 shown comprises two states "0" and "1", in which "0" means no voltage appeared or being inactivated at the output 739 of the self-diagnostic circuit 720 whereas "1" means that the output 739 of the self-diagnostic circuit 720 provides a high-level output voltage or is activated. In other words, the self-diagnostic circuit 720 sends the high-level output voltage to enable the LED driving circuit 650 via the port "E" during the test period 736 or 737.

Figure 5:
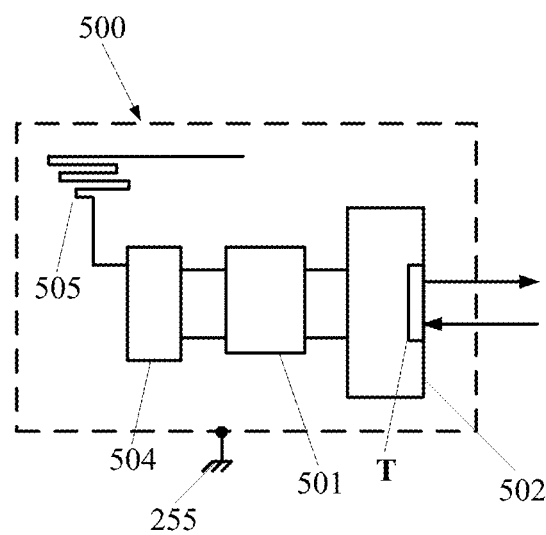
FIG. 5 is a block diagram of a first transceiver circuit according to the present disclosure.

FIG. 5 is a block diagram of a first transceiver circuit according to the present disclosure. The first transceiver circuit 500 comprises a first transceiver 501 and a decoder and controller 502. The first transceiver circuit 500 is coupled to the self-diagnostic circuit 720 via a serial data input and output interface "T" and configured to demodulate various phase-shift keying (PSK) band-pass signals via the decoder and controller 502 in response to the various PSK band-pass signals received by the first transceiver 501. When requested, the self-diagnostic circuit 720 may transmit the self-diagnostic test results and the information of the self-diagnostic test times to the first transceiver circuit 500. The first transceiver circuit 500 further comprises an antenna 505 either embedded on a printed circuit board (PCB) or wired outwards and a radio-frequency (RF) front-end transmitter/receiver 504 configured to provide a single-ended matched impedance between an input to the RF front-end transmitter/receiver 504 and an output from the first transceiver 501 for maximum transmit/receive efficiency. In other words, this important process is designed to ensure signals to transmit without signal reflections and with a required transmission power. The decoder and controller 502 comprises a microcontroller, a microchip, or a programmable logic controller.

Figure 6:
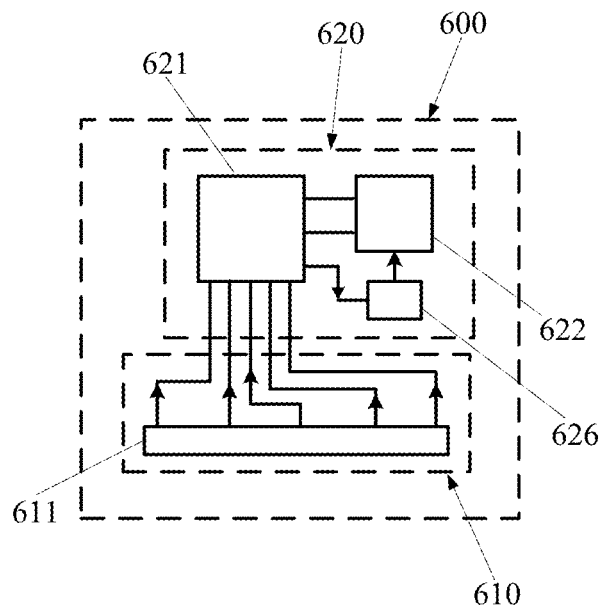
FIG. 6 is a block diagram of a remote controller according to the present disclosure.

FIG. 6 is a block diagram of a remote controller according to the present disclosure The remote controller 600 comprises a remote user interface 610 and a second transceiver circuit 620. The remote controller 600 is configured to send the PSK band-pass signals to the first transceiver circuit 500 in response to a plurality of signals generated from the remote user interface 610. The second transceiver circuit 620 comprises a second transceiver 622 and an encoder and controller 621. The encoder and controller 621 is coupled between the remote user interface 610 and the second transceiver 622 and configured to convert the plurality of signals into a plurality of sets of binary data characters. Each of the plurality of sets of binary data characters comprises command data. The remote user interface 610 comprises keyboards 611 in a computer-based emergency lighting management system. The keyboards 611 are configured to generate the plurality of signals. At least two of the plurality of signals are respectively configured to turn on and off the power supply unit 311, subsequently turning on and off the one or more LED arrays 214. At least two of the plurality of signals are respectively configured to initiate and to terminate the rechargeable battery test. At least one of the plurality of signals is configured to request the self-diagnostic test results and the information of self-diagnostic test times. The remote controller 600 further comprises a voltage regulator 626 with an enable input. The voltage regulator 626 is configured to supply a voltage to operate the second transceiver 622 in response to an enable signal from the encoder and controller 621.

Figure 7:
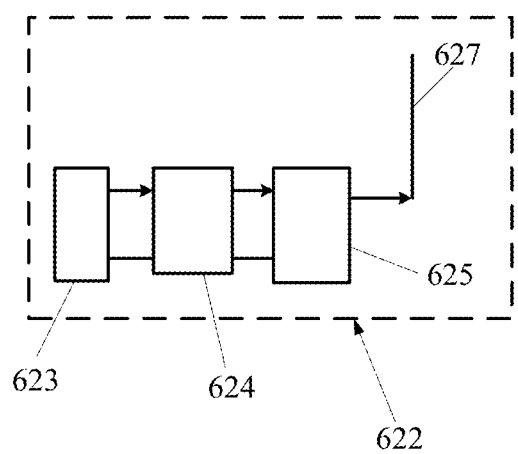
FIG. 7 is a block diagram of a second transceiver according to the present disclosure.

FIG. 7 is a block diagram of a second transceiver according to the present disclosure. The second transceiver 622 comprises a mixer 623, a front-end transmitter/receiver 624, an antenna 627 embedded on a PCB or wired outwards, and two or more inductors 625 interconnected in series. The mixer 623 is configured to modulate the plurality of sets of binary data characters onto a carrier wave with a carrier phase shifted by 180 degrees whenever a binary data character "0" is transmitted. It should be appreciated that PSK signaling outperforming amplitude-shift keying (ASK) and frequency-shift keying (FSK) can be found in Digital Communication Theory. Owing to simplicity and reduced error probability, the PSK signaling is widely used in wireless local area network (LAN) standard, IEEE 802.11 and IEEE 802.15 using two frequency bands: at 868-915 MHz with binary PSK (BPSK) and at 2.4 GHz with offset quadrature PSK (OQPSK).

Whereas preferred embodiments of the present disclosure have been shown and described, it will be realized that alterations, modifications, and improvements may be made thereto without departing from the scope of the following claims. Another kind of schemes with an emergency operated portion operated by using a real-time clock, a test and control unit, and various kinds of combinations to accomplish the same or different objectives could be easily adapted for use from the present disclosure. Accordingly, the foregoing descriptions and attached drawings are by way of example only and are not intended to be limiting.

What is claimed is:

1. A light-emitting diode (LED) luminaire, comprising:
   one or more LED arrays;
   a power supply unit configured to generate a main direct-current (DC) voltage with a first LED driving current to power up the one or more LED arrays at full power when a line voltage from alternate-current (AC) mains is available; and
   an emergency-operated portion, comprising:
      a rechargeable battery with a terminal voltage;
      at least one full-wave rectifier configured to convert the line voltage from the AC mains into a first DC voltage;
      a charging circuit comprising a charging control device and a first transformer, the charging circuit coupled to the at least one full-wave rectifier and configured to convert the first DC voltage into a second DC voltage that charges the terminal voltage of the rechargeable battery to reach a nominal third DC voltage;
      an LED driving circuit comprising an input inductor, an electronic switch, at least one diode rectifier, and an output capacitor coupled to the at least one diode rectifier, the LED driving circuit configured to convert the terminal voltage of the rechargeable battery into a fourth DC voltage with a second LED driving current to sustain lighting up the one or more LED arrays at a fraction of the full power when the line voltage from the AC mains is unavailable;
      a control and test circuit comprising a self-diagnostic circuit and a charging detection and control circuit, the control and test circuit configured to enable or disable the LED driving circuit and the power supply unit according to availability of the AC mains and whether a rechargeable battery test is initiated, the self-diagnostic circuit comprising a test and control unit comprising a test portion and a control portion; and
      a first transceiver circuit comprising a first transceiver and a decoder and controller, the first transceiver circuit configured to receive and demodulate various phase-shift keying (PSK) band-pass signals and to communicate with the self-diagnostic circuit,
   wherein:
      the charging circuit, the LED driving circuit, the power supply unit, and the control and test circuit are configured to auto-select either the main DC voltage or the fourth DC voltage to operate the one or more LED arrays; and
      the self-diagnostic circuit further comprises a real-time clock, wherein the self-diagnostic circuit is configured to initiate the rechargeable battery test according to a plurality of predetermined test schedules provided by the real-time clock, wherein each of the predetermined test schedules comprises a test period immediately following an initiation of a test event, wherein, upon the initiation of the test event, the test period begins with an output of the self-diagnostic circuit activated to reach a logic-high level and remaining activated so as to enable the LED driving circuit and the test and control unit, wherein, at an end of the test period, the output of the self-diagnostic circuit is inactivated to drop to a logic-low level, and wherein a duration of the test period is configured to allow the self-diagnostic circuit to control discharging of the rechargeable battery and to perform the rechargeable battery test.

2. The LED luminaire of claim 1, wherein the real-time clock starts with a reset, wherein the predetermined test schedules comprise a first kind of the test event and a second kind of the test event respectively at an end of each month and at an end of each year after the reset, and wherein respective test periods of the predetermined test schedules comprise a nominal duration of 30 seconds and 90 minutes.

3. The LED luminaire of claim 1, wherein the charging detection and control circuit further comprises a first transistor circuit configured to detect a charging voltage, wherein the charging detection and control circuit is coupled between the charging circuit and the rechargeable battery and controlled by the self-diagnostic circuit, and wherein, in response to detecting a charging voltage, the first transistor circuit sends a pull-down signal to the self-diagnostic circuit to enable a charging process.

4. The LED luminaire of claim 1, wherein the charging detection and control circuit further comprises a charging control circuit comprising a second transistor circuit and a metal-oxide-semiconductor field-effect transistor (MOSFET), wherein the charging control circuit is configured to either allow or prohibit a charging current to flow into the rechargeable battery according to availability of the AC mains, and wherein the charging control circuit is further configured to prohibit the charging current to flow into the rechargeable battery when the rechargeable battery test is initiated.

5. The LED luminaire of claim 4, wherein the second transistor circuit is configured to receive a signal with a voltage level approximately equal to an operating voltage of the self-diagnostic circuit therefrom to pull down a bias voltage of the MOSFET, thereby disconnecting the charging current when the rechargeable battery test is initiated.

6. The LED luminaire of claim 1, wherein the charging detection and control circuit further comprises at least one pair of electrical contacts configured to electrically couple the rechargeable battery to the charging circuit, the LED driving circuit, and the self-diagnostic circuit, wherein, when connected, the at least one pair of electrical contacts allows the rechargeable battery to power up the LED driving circuit and the self-diagnostic circuit when the rechargeable battery test is initiated or when the line voltage from the AC mains is unavailable, and wherein, when disconnected, the at least one pair of electrical contacts prevents the rechargeable battery from being drained.

7. The LED luminaire of claim 1, wherein the charging detection and control circuit further comprises a peripheral circuit configured to sample a fraction of the terminal voltage of the rechargeable battery and to deliver to the test portion to examine over the duration of the test period when the rechargeable battery test is initiated.

8. The LED luminaire of claim 7, wherein the test portion is configured to perform a pass/fail test, and wherein, when the terminal voltage drops below a first predetermined level over the duration of the test period, the test portion assesses a failure for the rechargeable battery test.

9. The LED luminaire of claim 8, wherein the real-time clock further comprises a random-access memory (RAM), wherein the self-diagnostic circuit further comprises a data bus connected to the real-time clock, and wherein, at the end of the test period, a test result of the pass/fail test is serially transmitted via the data bus to the RAM.

10. The LED luminaire of claim 9, wherein the RAM is configured to store multiple attribute data of self-diagnostic test results in multiple pass/fail tests over the predetermined test schedules with information of self-diagnostic test times.

11. The LED luminaire of claim 10, wherein both the multiple attribute data of the self-diagnostic test results and the information of the self-diagnostic test times are serially transferred to the first transceiver circuit when requested.

12. The LED luminaire of claim 11, wherein the real-time clock further comprises a primary power supply, a backup power supply, and a built-in power-sense circuit configured to detect power outages and to automatically switch from the primary power supply to the backup power supply to sustain operating the real-time clock without a loss of the predetermined test schedules, the multiple attribute data of the self-diagnostic test results, and the information of the self-diagnostic test times.

13. The LED luminaire of claim 6, wherein the charging detection and control circuit further comprises a test switch coupled to the self-diagnostic circuit and configured to initiate and terminate either a 30-second test or a 90-minute test of the rechargeable battery.

14. The LED luminaire of claim 13, wherein the charging detection and control circuit further comprises at least one status indicator configured to couple to the self-diagnostic circuit, and wherein, when either the 30-second test or the 90-minute test is initiated and when the terminal voltage is examined to be respectively lower than either a second predetermined level or a third predetermined level, the self-diagnostic circuit chooses not to perform respective tests with a status signal sent to the at least one status indicator to show that the rechargeable battery is insufficiently charged for the respective tests.

15. The LED luminaire of claim 1, wherein the test and control unit comprises a microcontroller, a microchip, a microprocessor, or a programmable logic controller.

16. The LED luminaire of claim 1, further comprising:
a remote controller comprising a remote user interface and a second transceiver circuit, the remote controller configured to send the PSK band-pass signals to the first transceiver circuit in response to a plurality of signals from the remote user interface, wherein the second transceiver circuit comprises a second transceiver and an encoder and controller coupled between the remote user interface and the second transceiver and configured to convert the plurality of signals into a plurality of sets of binary data characters, and wherein each of the plurality of sets of binary data characters comprises command data.

17. The LED luminaire of claim 16, wherein the remote user interface comprises keyboards in a computer-based emergency lighting management system, the keyboards configured to generate the plurality of signals.

18. The LED luminaire of claim 16, wherein at least two of the plurality of signals are respectively configured to turn on and off the power supply unit.

19. The LED luminaire of claim 16, wherein at least two of the plurality of signals are respectively configured to initiate and to terminate the rechargeable battery test.

20. The LED luminaire of claim 16, wherein at least one of the plurality of signals is configured to request self-diagnostic test results and information of self-diagnostic test times.

* * * * *